(12) United States Patent
Huang et al.

(10) Patent No.: US 6,353,567 B1
(45) Date of Patent: Mar. 5, 2002

(54) DATA OUTPUTTING CIRCUIT FOR SEMICONDUCTOR MEMORY DEVICE

(75) Inventors: Shih-Huang Huang; Hsin-Pang Lu, both of Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/684,801

(22) Filed: Oct. 6, 2000

(51) Int. Cl.⁷ .................................................. G11C 7/00
(52) U.S. Cl. .................. 365/203; 365/189.11; 365/207; 365/208; 365/189.05
(58) Field of Search .............................. 365/203, 206, 365/207, 208, 189.11, 189.05

(56) References Cited

U.S. PATENT DOCUMENTS

| 4,685,087 A | * | 8/1987 | Shah | 365/227 |
| 5,381,374 A | * | 1/1995 | Shiraishi et al. | 365/203 |
| 5,553,029 A | * | 9/1996 | Reohr et al. | 365/208 |
| 5,959,918 A | * | 9/1999 | Arimoto | 365/205 |
| 5,982,689 A | * | 11/1999 | Takahashi | 365/205 |
| 6,023,436 A | * | 2/2000 | Han | 365/203 |

* cited by examiner

Primary Examiner—Son T. Dinh

(57) ABSTRACT

A data outputting circuit for semiconductor memory device, comprising a pre-charging unit, a data pre-sensing unit made up of a first sense amplifier, a second sense amplifier and an inverter, a data sense amplifier and an output buffer. The data pre-sensing unit is respectively coupled to a position in a first data line having one half loading and a position in a second data line having one half loading. One of the respective signals of the first data line and the second data line is amplified and the other of the respective signals is maintained after passing through the data pre-sensing unit. Thereby, the signal difference between the first data line and the second data line is amplified by means of the data pre-sensing unit and is sufficient to facilitate sensing of the data sense amplifier, even though there exists large loading both in the first data line and the second data line.

13 Claims, 5 Drawing Sheets

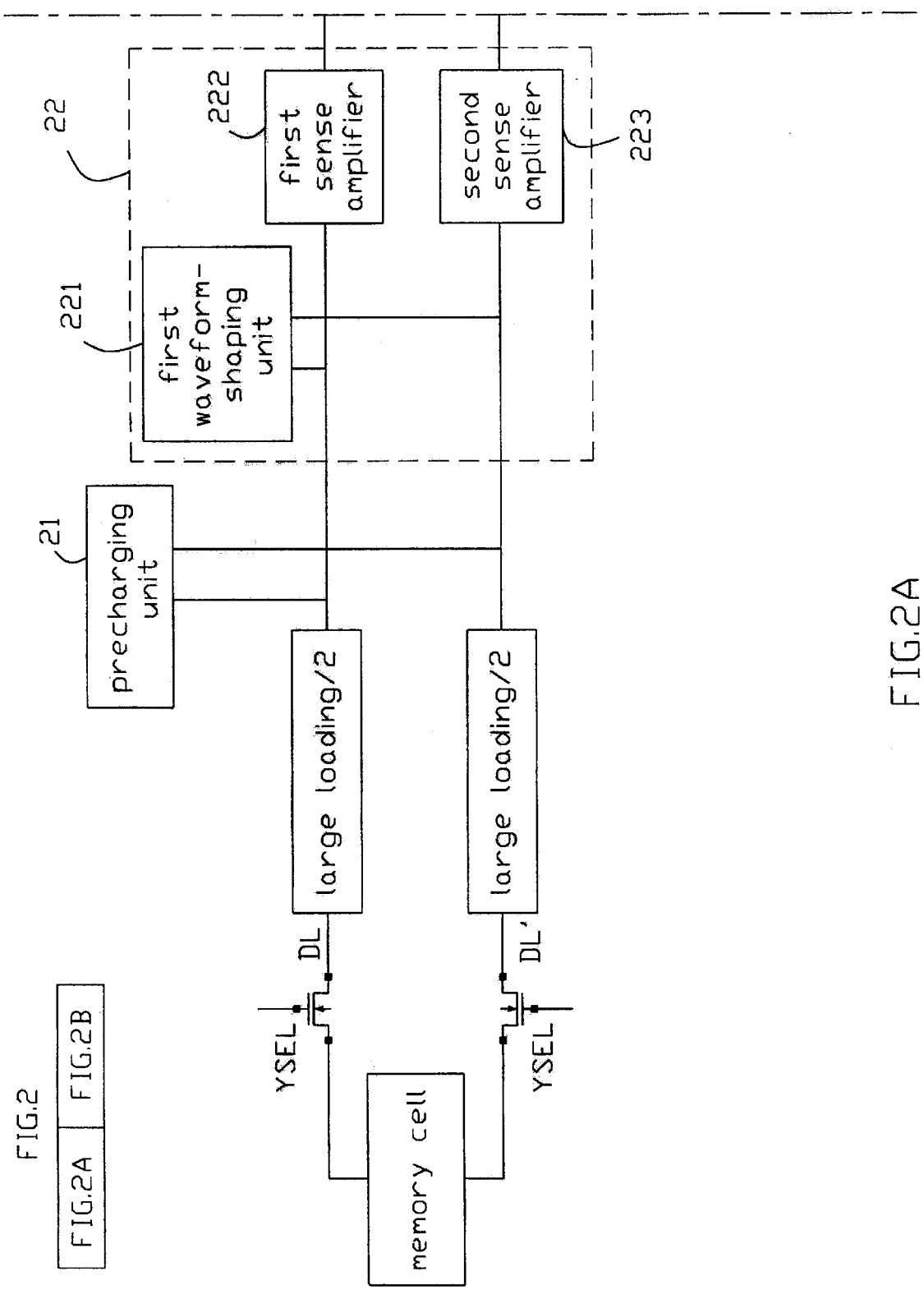

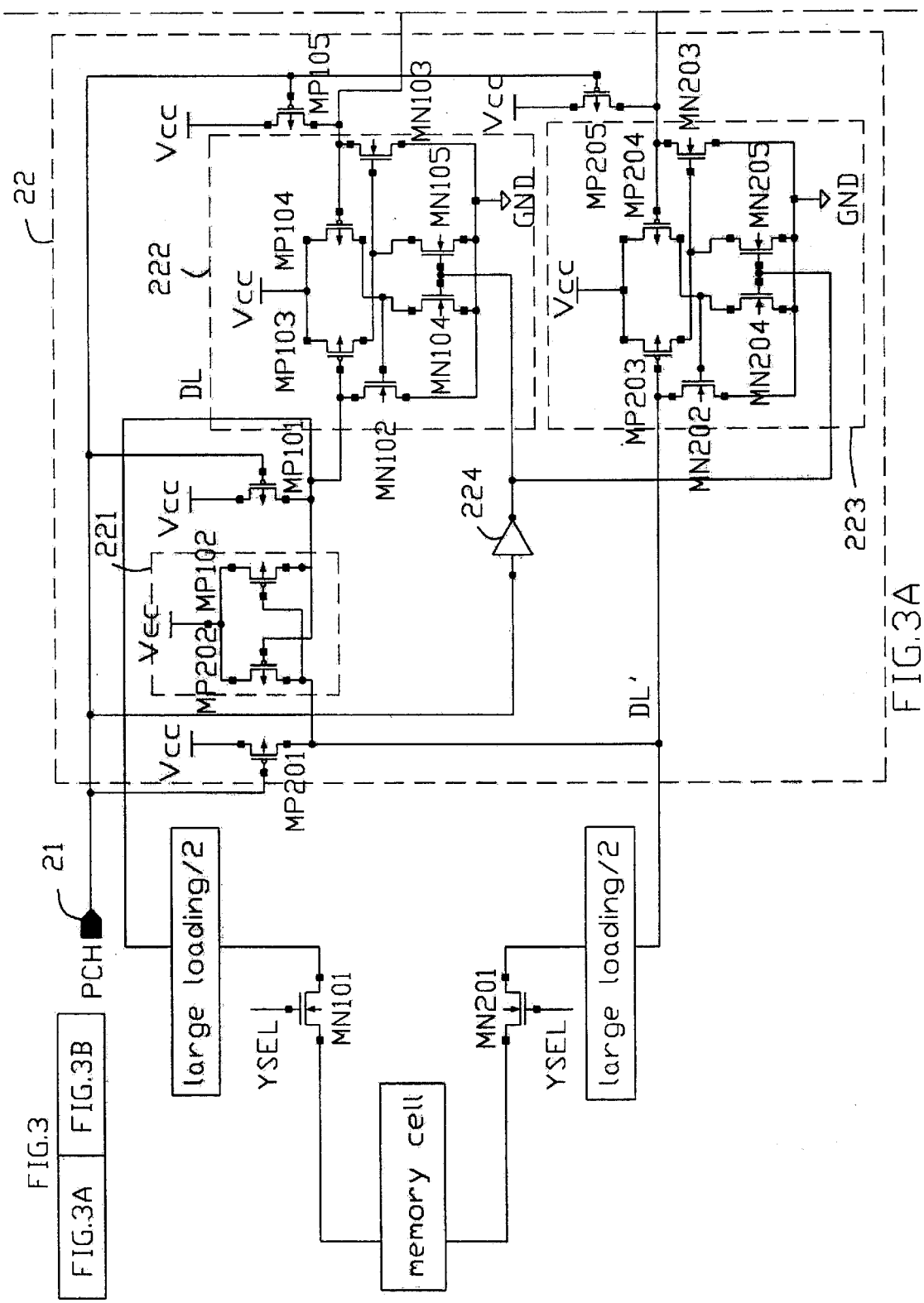

US 6,353,567 B1

DATA OUTPUTTING CIRCUIT FOR SEMICONDUCTOR MEMORY DEVICE

BACKGROUND OF THE INVENTION

1. Field of the Invention

The present invention relates generally to a semiconductor memory device, more particularly to a data outputting circuit for reading data from a semiconductor memory device.

2. Description of the Prior Art

FIG. 1 illustrates a schematic block diagram of a conventional data outputting circuit incorporated in a semiconductor memory device, which shows data transmitting path. The data outputting circuit includes a data sense amplifier 11 and an output buffer 12. A switch circuit 10 formed of an address select column consisting of a plurality of NMOS transistors, sets between a memory device and the outputting circuit. The switching circuit 10 is connected to a pair of data lines DL and DL'. Cell information is read from one of memory cells in the memory device. The cell information is then provided as a pair of complementary data to the data outputting circuit of the memory device via the switching circuit 10 and the data lines DL and DL'.

In general, the respective signals of the data lines DL and DL' formed of the pair of complementary data from the selected memory cell are directly transmitted to the data sense amplifier 11 for sensing signal difference therebetween and amplifying these two respective signals. Thereafter, the two respective signals are received and stored in the output buffer 12 for output. However, in case that there is large loading existing both in the two data lines DL and DL' due to the long data lines, it takes a longer time to generate sufficient signal difference between the data lines DL and DL' to enable the data sense amplifier 11 sensing the exact signal difference and make right action. Hence the sensing time of the data sense amplifier 11 will be delayed and the speed for data output is significantly reduced.

Accordingly, it is desirable to provide a data outputting circuit for semiconductor memory device, which can alleviate long-time sensing effect of the data sense amplifier resulting from large loading existing in the data lines.

SUMMARY OF THE INVENTION

It is one object of the present invention to provide a data outputting circuit for semiconductor memory device, in which a data pre-sensing unit, respectively coupled to a position in a first data line having one half loading and a position in a second data line having one half loading. One of respective signals of the first data line and the second data line is grounded and the other of the respective signals is maintained by means of the data pre-sensing unit, so that signal difference between the first data line and the second data line is amplified after passing through the data pre-sensing unit, and is sufficient to facilitate sensing of a data sense amplifier, even though there exists large loading both in the first data line and the second data line.

It is another object of the present invention to provide a data outputting circuit for a semiconductor memory device, which comprises a data pre-sensing unit respectively coupled to a first data line and a second data line before the two data lines transmit to a data sense amplifier. The data pre-sensing unit amplifies one of respective signals of the first data line and the second data line, while maintaining the other of the respective signals, and thereby amplifying signal difference between the first data line and the second data line. Therefore, the long-time sensing effect of the data sense amplifier for sensing the signal difference between the first data line and the second data line due to the fact that large loading existing in the two data lines is eliminated.

In order to achieve the above objects, the present invention provides a data outputting circuit for a semiconductor memory device, comprising a pre-charging unit, a data pre-sensing unit made up of a first sense amplifier, a second sense amplifier and an inverter, a data sense amplifier and an output buffer. The data pre-sensing unit is respectively coupled to a position in a first data line having one half loading and a position in a second data line having one half loading. One of the respective signals of the first data line and the second data line is amplified and the other of the respective signals is maintained after passing through the data pre-sensing unit. Thereby, the signal difference between the first data line and the second data line is amplified by means of the data pre-sensing unit and is sufficient to facilitate sensing of the data sense amplifier, even though there exists large loading both in the first data line and the second data line.

BRIEF DESCRIPTION OF THE DRAWINGS

The present invention can be best understood through the following description and accompanying drawings wherein:

FIG. 2 is a combination of FIG. 2A and 2B, depicting a schematic block diagram of a preferred embodiment of the present invention showing data transmitting path, wherein FIG. 2A is one part of the schematic block diagram and FIG. 2B is the other part of the schematic block diagram; and FIG. 3 is a combination of FIG. 3A and 3B, wherein FIG. 3A depicts one part of the circuit diagram of the preferred embodiment of the present invention and FIG. 3B depicts the other part of the circuit diagram of the preferred embodiment of the present invention.

DESCRIPTION OF THE PREFERRED EMBODIMENT

Figure 1:
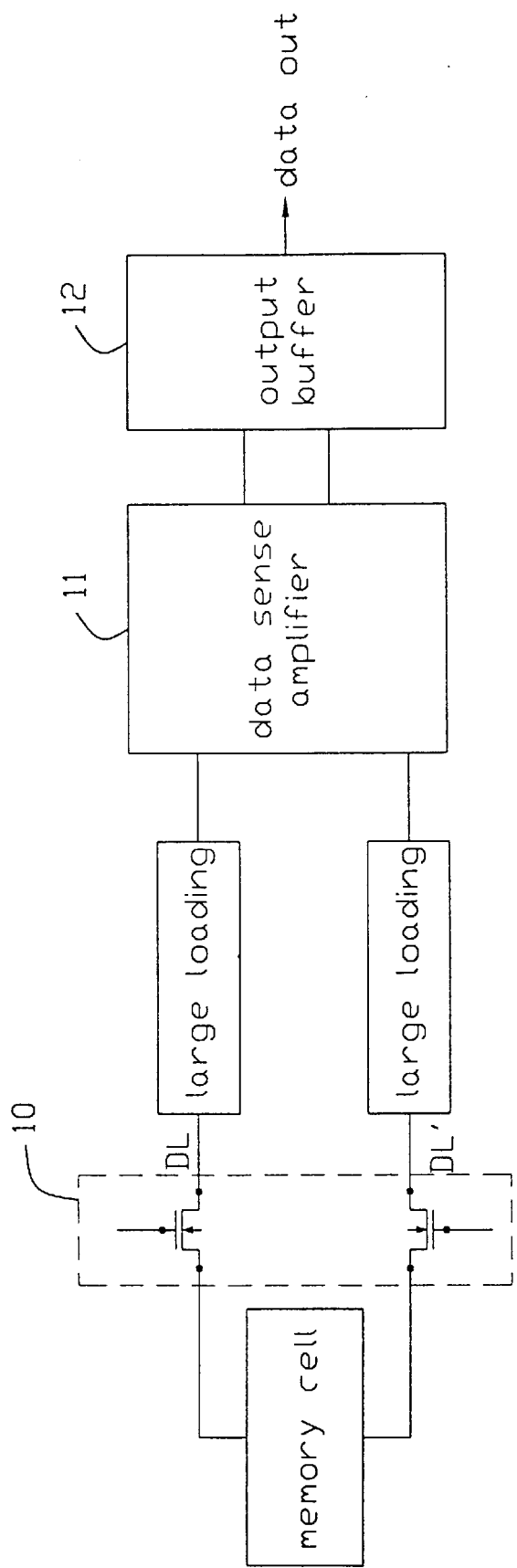
FIG. 1 depicts a schematic block diagram of a conventional data outputting circuit for a memory device, showing data transmitting path.
Figure 2B:
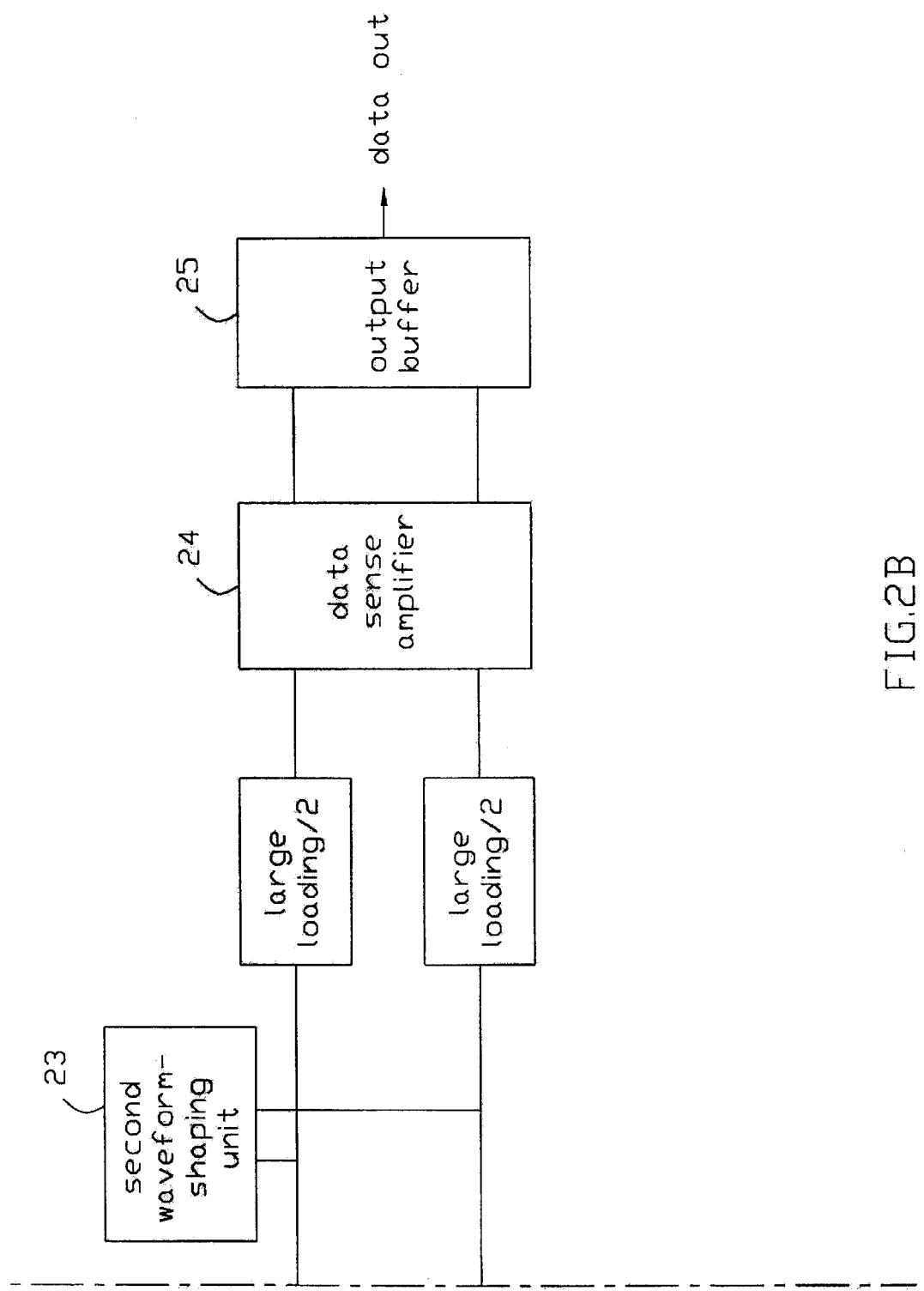

Preferred embodiment of this invention will be explained with reference to FIG. 2A to FIG. 3B.

The data outputting circuit of the preferred embodiment of the present invention is made up of a pre-charging unit 21, a data pre-sensing unit 22 including a first waveform-shaping unit 221, a first sense amplifier 222, a second sense amplifier 223 and an inverter 224, a second waveform-shaping unit 23, a data sense amplifier 24 and an output buffer 25.

The data pre-sensing unit 22 is respectively coupled to a position in a first data line DL having one half loading and a position in a second data line DL' having one half loading. When respective signals of the first data line DL and the second data line DL' are transmitted to the data pre-sensing unit 22, one of the first sense amplifier unit 222 and the second sense amplifier unit 223 is turn on, and the other is turn off. Then, only one of the respective signals of the first data line DL and the second data line DL' is amplified, and the other signal is maintained. Therefore, the signal difference between the first data line DL and the second data line DL' is amplified through the data pre-sensing unit 22. And, the signal difference is sufficiently large to facilitate sensing of the data sense amplifier 24, even through there existing large loading both in the first data line DL and the second data line DL', for example, occurred due to the long data lines.

Figure 3B:
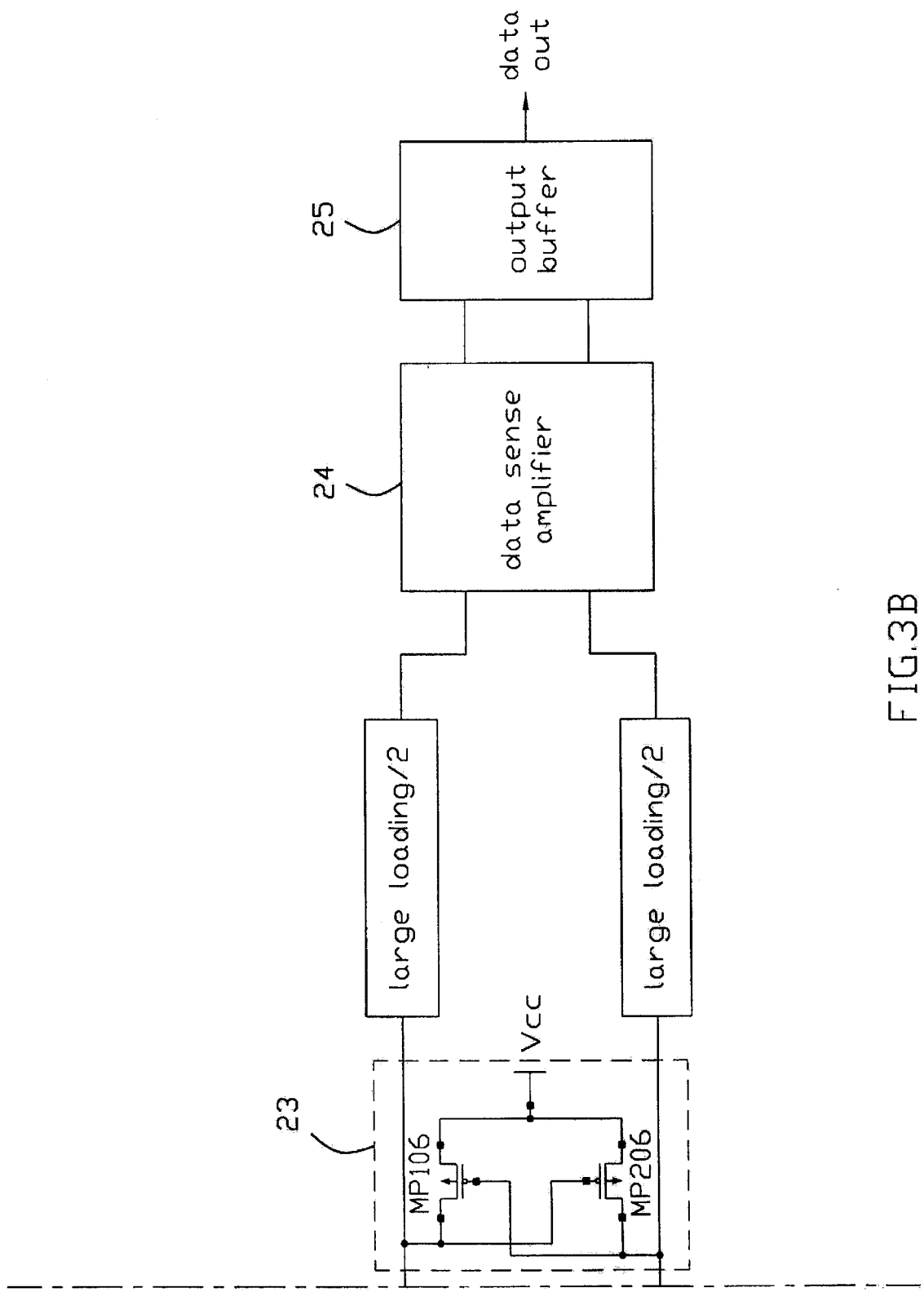

FIG. 3A and 3B show a combination of the circuit diagram of the preferred embodiment. The pre-charging unit 21 denoted as "PCH" is respectively connected to respective gate electrodes of PMOS transistors MP101, MP201, MP105 and MP205, and coupled to a first data line DL, a second data line DL', the first sense amplifier 222 and the second sense amplifier 223, respectively via the PMOS transistors MP101, MP201, MP105 and MPO205. The first data line DL is connected to the drain of the PMOS transistor MP101, and a power supply voltage Vcc is connected to the source of the PMOS transistor MP101. The second data line DL' is connected to the drain of the PMOS transistor MP201, and a power supply voltage Vcc is connected to the source of the PMOS transistor MP201. The drain of the PMOS transistor MP105 is respectively connected to a source of a NMOS transistor MN103 and a gate electrode of a PMOS transistor MP104 of the first sense amplifier 222, and the source of the PMOS transistor MP105 is connected to a power supply voltage Vcc. The drain of the PMOS transistor MP205 is connected to a source of a NMOS transistor MN203 and a gate electrode of a PMOS transistor MP204 of the second sense amplifier 223, and the source of the PMOS transistor MP205 is connected to a power supply voltage Vcc. The first waveform-shaping unit 221 is made up of two PMOS transistors MP102 and MP202. The joint source of the PMOS transistors MP102 and MP202 is connected to a power supply voltage Vcc. The first data line DL is respectively connected to the drain of the PMOS transistor MP102 and the gate electrode of the PMOS transistor MP202. The second data line DL' is respectively connected to the drain of the PMOS transistor MP202 and the gate electrode of the PMOS transistor MP102. The first sense amplifier 222 is made up of two PMOS transistors MP103 and MP104 and four NMOS transistors MN102, MN103, MN104 and MN105. The second sense amplifier 223 is made up of two PMOS transistors MP203 and MP204 and four NMOS transistors of MN202, MN203, MN204 and MN205. The inverter 224 is formed of, for example, a CMOS transistor.

The first data line DL is respectively connected to the gate electrode of the PMOS transistor MP103 and the source of the NMOS transistor MN102 of the first sense amplifier 222. The second data line DL' is respectively connected to the gate electrode of the PMOS transistor MP203 and the source of the NMOS transistor MN202 of the second sense amplifier 223. The input terminal of the inverter 224 is connected to the pre-charging unit 21, and the output terminal of the inverter 224 is respectively connected to the respective gate electrodes of the NMOS transistors MN104 and MN105 of the first sense amplifier 222 and the NMOS transistors MN204 and MN205 of the second sense amplifier 223. The joint source of the two PMOS transistors MP103 and MP104 is connected to a power supply voltage Vcc, and the joint source of the PMOS transistors MP203 and MP204 is connected to a power supply voltage Vcc. The drain of the PMOS transistor MP103 is respectively connected to the source of the NMOS transistor MN105 and the gate electrode of the NMOS transistor MN103. The drain of the PMOS transistor MP104 is respectively connected to the source of the NMOS transistor MN104 and the gate electrode of the NMOS transistor MN102. The joint drain of the NMOS transistors MN102, MN103, MN104 and MN105 is grounded. The drain of the PMOS transistor MP203 is respectively connected to the source of the NMOS transistor MN205 and the gate electrode of the NMOS transistor MN203. The drain of the PMOS transistor MP204 is respectively connected to the source of the NMOS transistor MN204 and the gate electrode of the NMOS transistor MN202. The joint drain of the NMOS transistors MN202, MN203, MN204 and MN205 is grounded. The second waveform-shaping unit 23 is formed of two PMOS transistors MP106 and MP206. A power supply of voltage Vcc is connected to the joint source of the PMOS transistors MP106 and MP206. The gate electrode of the PMOS transistor MP104 is respectively connected to the gate electrode of PMOS transistor MP206 and the drain of the PMOS transistor MP106 of the second waveform-shaping unit 23 and the data sense amplifier 24. The gate electrode of the PMOS transistor MP204 is respectively connected to the gate electrode of PMOS transistor MP106 and the drain of the PMOS transistor MP206 of the second waveform-shaping unit 23 and the data sense amplifier 24.

The operation of the data outputting circuit of the preferred embodiment of the present invention will be described as follows. When power is applied to the memory, but no memory cell has been designated for a data read. The output of the pre-charging unit 21 is low, and then the first data line DL and the second data line DL' are pre-charged to a voltage Vcc, respectively via the PMOS transistors MP101 and MP201. When a signal YSEL having logic level "high" of a select address column is respectively transmitted to the gate electrodes of NMOS transistors MN101 and MN201, the NMOS transistors MN101 and MN201 are turn on, and then the signal having a logic level "high" is transmitted to the first data line DL and the signal having a logic level "low" is transmitted to the second data line DL'. The output of the pre-charging unit 21 is high, and thus the PMOS transistors MP101, MP201, MP105 and MP205 are turn off. The PMOS transistor MP104 and the NMOS transistor MN102 of the first sense amplifier 222 and the PMOS transistor MP204 and the NMOS transistor MN202 of the second sense amplifier 223 are turn on. The output terminal of the inverter 224 is low, and then the NMOS transistors MN104 and MN105 of the first sense amplifier 222 and the NMOS transistors MN204 and MN205 of the second sense amplifier 223 are turn off. The respective signals of the first data line DL and the second data line DL' are respectively transmitted to the data pre-sensing unit 22. The PMOS transistor MP102 of the first waveform-shaping unit 221 is turn on and the PMOS transistor MP202 of the first waveform-shaping unit 221 is turn off. Thereby, the waveform of the signal of the first data line DL having logic level "high" is shaped through the PMOS transistor MP102. The signal of the first data line DL is transmitted to the gate electrode of the PMOS transistor MP103, and then the PMOS transistor MP103 is turn off, thereby the NMOS transistor MN103 is turn off. Therefore, the signal of the first data line DL is maintained to the high logic level after passing through the first sense amplifier 222 of the data pre-sensing unit 22. The signal of the second data line DL' having a logic level "low" is transmitted to the gate electrode of the PMOS transistor MP203, and then the PMOS transistor MP203 and the NMOS transistor MN203 are turn on. Therefore, the signal of the second data line DL' is grounded after passing through the second sense amplifier 223 of the data pre-sensing unit 22. The respective signals of the first data line DL and the second data line DL' after passing through the data pre-sensing unit 22 are respectively transmitted to the second waveform-shaping unit 23, and thereby the PMOS transistor MP106 is turn on and the PMOS transistor MP206 is turn off. Hence, the waveform of the signal of the first data line DL after passing through the first sense amplifier 222 is shaped through the PMOS transistor MP106 of the second waveform-shaping unit 23. Therefore, the signal difference between the first data line DL and the second data line DL' is amplified after passing through the data pre-sensing unit 22, and is sufficiently large to facilitate sensing of the data sense amplifier 24, even through there existing large loading both in the first data line DL and the second data line DL', due to, for example, the long data lines. The signal difference between the first data line DL and the second data line DL' is sensed and amplified through the data sense amplifier 24, and then the two signals of the first data line DL and the second data line DL' are received and stored in the output buffer 25 for output.

The preferred embodiment is only used to illustrate the present invention, not intended to limit the scope thereof. Many modifications of the preferred embodiment can be made without departing from the spirit of the present invention.

What is claimed is:

1. A data outputting circuit for semiconductor memory device, comprising:
    a pre-charging unit, respectively coupled to a first data line and a second data line;
    a data pre-sensing unit, respectively coupled to a position in said first data line having one half loading and a position in said second data line having one half loading and said pre-charging unit, said data pre-sensing unit amplifying one respective signal of said first data line and said second data line and maintaining the other respective signal thereof;
    a data sense amplifier, respectively coupled to said first data line and said second data line after passing through said data pre-sensing unit, said data sense amplifier sensing and amplifying signal difference between said first data line and said second data line after passing through said data pre-sensing unit; and
    an output buffer, coupled to said data sense amplifier for storing said respective signals of said first data line and said second data line passing through said data sense amplifier.

2. The data outputting circuit of claim 1, wherein said data outputting circuit further comprises a second waveform-shaping unit, respectively coupled to said first data line and said second data line after passing through said data pre-sensing unit.

3. The data outputting circuit of claim 1, wherein said data pre-sensing unit further comprises:
    a first waveform-shaping unit, respectively coupled to said position in said first data line having one half loading and said position in said second data line having one half loading;
    a first sense amplifier, respectively coupled to said position in said first data line having one half loading and said pre-charging unit;
    a second sense amplifier, respectively coupled to said position in said second data line having one half loading and said pre-charging unit; and
    an inverter, an input terminal of said inverter coupled to said pre-charging unit, and an output terminal of said inverter respectively coupled to said first sense amplifier and said second sense amplifier.

4. The data outputting circuit of claim 2, wherein said second waveform-shaping unit further comprises two P type transistors.

5. The data outputting circuit of claim 3, wherein said first sense amplifier further comprises four N type transistors and two P type transistors.

6. The data outputting circuit of claim 3, wherein said second sense amplifier further comprises four N type transistors and two P type transistors.

7. The data outputting circuit of claim 3, wherein said inverter is formed of a CMOS transistor.

8. The data outputting circuit of claim 3, wherein said first sense amplifier is coupled to said pre-charging unit via a P type transistor.

9. The data outputting circuit of claim 3, wherein said second sense amplifier is coupled to said pre-charging unit via a P type transistor.

10. The data outputting circuit of claim 3, wherein said first waveform-shaping unit further comprises two P type transistors.

11. A data outputting circuit for semiconductor memory device, comprising:
    a pre-charging unit, coupled to a first data line and a second data line, respectively via a PMOS transistor;
    a data pre-sensing unit including a first waveform-shaping unit, a first sense amplifier, a second sense amplifier and an inverter, said first waveform-shaping unit formed of two PMOS transistors each of said two PMOS transistors respectively coupled to said first data line and said second data line, said first sense amplifier and said second sense amplifier respectively formed of two PMOS transistors and four NMOS transistors and respectively connected to said first data line and said second data line, and coupled to said pre-charging unit, respectively via a PMOS transistor, an input terminal of said inverter coupled to said pre-charging unit and an output terminal of said inverter respectively coupled to said first sense amplifier and said second sense amplifier;
    a second waveform-shaping unit formed of two PMOS transistors each of said two PMOS transistors respectively coupled to said first data line and said second data line after passing through said data pre-sensing unit;
    a data sense amplifier, respectively coupled to said first data line and said second data line after passing through said data pre-sensing unit, said data sense amplifier amplifying signal difference between said first data line and said second data line; and
    an output buffer, coupled to said data sense amplifier, said output buffer storing respective signals of said first data line and said second data line passing through said data sense amplifier;
    wherein when said respective signals of said first data line and said second data line pass through said data pre-sensing unit, one of said respective signals is amplified, and the other of said respective signals is maintained.

12. The data outputting circuit of claim 11, wherein said data pre-sensing unit is respectively coupled to a position in said first data line having one half loading and a position in said second data line having one half loading.

13. The data outputting circuit of claim 11, wherein said inverter of said data pre-sensing unit is formed of a CMOS transistor.

* * * * *